United States Patent
Yonak et al.

(10) Patent No.: US 8,674,792 B2
(45) Date of Patent: Mar. 18, 2014

(54) TUNABLE METAMATERIALS

(75) Inventors: Serdar H. Yonak, Ann Arbor, MI (US); Frederick W. Mau, II, Royal Oaks, MI (US); Vinh N. Nguyen, Durham, NC (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 854 days.

(21) Appl. No.: 12/027,325

(22) Filed: Feb. 7, 2008

(65) Prior Publication Data

US 2010/0301971 A1 Dec. 2, 2010

(51) Int. Cl.
| H01P 1/203 | (2006.01) |
| H01P 7/08 | (2006.01) |
| H01Q 19/06 | (2006.01) |
| G02B 3/00 | (2006.01) |
| G02B 9/00 | (2006.01) |

(52) U.S. Cl.
USPC ............ 333/205; 333/235; 343/754; 359/652

(58) Field of Classification Search
USPC ......... 333/165–168, 175, 176, 185, 202, 204, 333/205, 219, 235; 361/277, 281; 343/754; 359/652
See application file for complete search history.

(56) References Cited

U.S. PATENT DOCUMENTS

| 5,721,194 A * | 2/1998 | Yandrofski et al. ........... 505/210 |
| 6,795,338 B2 | 9/2004 | Parkinson et al. |
| 6,882,460 B2 | 4/2005 | Tsu et al. |
| 6,933,812 B2 | 8/2005 | Sarabandi et al. |
| 6,958,729 B1 | 10/2005 | Metz |
| 6,985,373 B2 | 1/2006 | Tsu |
| 7,006,052 B2 | 2/2006 | Delgado et al. |
| 7,015,865 B2 | 3/2006 | Isaacs et al. |
| 7,030,834 B2 | 4/2006 | Delgado et al. |
| 7,068,234 B2 | 6/2006 | Sievenpiper |
| 7,088,308 B2 | 8/2006 | Delgado et al. |
| 7,106,494 B2 | 9/2006 | Osipov et al. |
| 7,145,412 B2 * | 12/2006 | Hunt et al. ................. 333/24 R |
| 7,164,387 B2 | 1/2007 | Sievenpiper |
| 7,218,285 B2 | 5/2007 | Davis et al. |
| 7,245,269 B2 | 7/2007 | Sievenpiper et al. |

(Continued)

FOREIGN PATENT DOCUMENTS

| EP | 1596470 | 11/2005 |
| WO | 2006023195 | 3/2006 |
| WO | 2007011727 | 1/2007 |
| WO | 2007098061 | 8/2007 |

OTHER PUBLICATIONS

Kuphaldt, "Lessons in Electric Circuits", Oct. 18, 2006, vol. I, p. 450.*

(Continued)

*Primary Examiner* — Benny Lee
*Assistant Examiner* — Gerald Stevens
(74) *Attorney, Agent, or Firm* — Gifford, Krass, Sprinkle, Anderson & Citkowski, P.C.

(57) ABSTRACT

A metamaterial comprises a support medium, such as a planar dielectric substrate and a plurality of resonant circuits supported thereby. At least one resonant circuit is a tunable resonant circuit including a conducting pattern and a tunable material, so that an electromagnetic parameter (such as resonance frequency) may be adjusted using an electrical control signal applied to the tunable material.

7 Claims, 12 Drawing Sheets

(56) References Cited

U.S. PATENT DOCUMENTS

| | | | |
|---|---|---|---|
| 7,253,780 | B2 | 8/2007 | Sievenpiper |
| 2005/0073744 | A1 | 4/2005 | Zheludev et al. |
| 2005/0212705 | A1 | 9/2005 | Legay et al. |
| 2006/0109541 | A1 | 5/2006 | Osipov et al. |
| 2007/1018838 | | 8/2007 | Hyde at al |
| 2007/0290774 | A1* | 12/2007 | Wyeth et al. .................. 333/262 |
| 2009/0096545 | A1* | 4/2009 | O'Hara et al. ................. 332/129 |
| 2009/0109516 | A1* | 4/2009 | Wang et al. ................... 359/290 |

OTHER PUBLICATIONS

D.R. Smith, D.C. Vier, N. Kroll, and S. Schultz. "Direct calculation of permeability and permittivity for a left-handed metamaterial." Applied Physics Letters, vol. 77, No. 14, pp. 2246-2248. Oct. 2, 2000. American Institute of Physics.

D.R. Smith, J.J. Mock, A.F. Starr, and D. Schurig. "Gradient index metamaterials." Physical Review E 71, 036609 (2005), pp. 036609 1-6. The American Physical Society.

D. Schurig, J.J. Mock, and D.R. Smith, Duke University, Department of ECE. "Electric-field-coupled resonators for negative permittivity metamaterials." Applied Physics Letters 88, 041109 (2006), pp. 041109 1-3. American Institute of Physics.

Ali Tombak, Student Member, IEEE, Jon-Paul Maria, Francisco Ayguavives, Zhang Jin, Student Member, IEEE, Gregory T. Stauf, Angus I. Kingon, Member, IEEE, and Amir Mortazawi, Member, IEEE. "Tunable Barium Strontium Titanate Thin Film Capacitors for RF and Microwave Applications." IEEE Microwave and Wireless Components Letters 2002, vol. 12, No. 1, Jan. 2002, pp. 3-5.

N.K. Pervez, P.J. Hansen, and R.A. York, Department of Electrical and Computer Engineering and Materials Department, University of California, Santa Barbara, California. "High tunability barium strontium titanate thin films for rf circuit applications." Applied Physics Letters 2004, vol. 85, No. 19, Nov. 8, 2004, pp. 4451-4453.

US 2007/0077401 A1, 04/2007, Pinto (withdrawn)

* cited by examiner

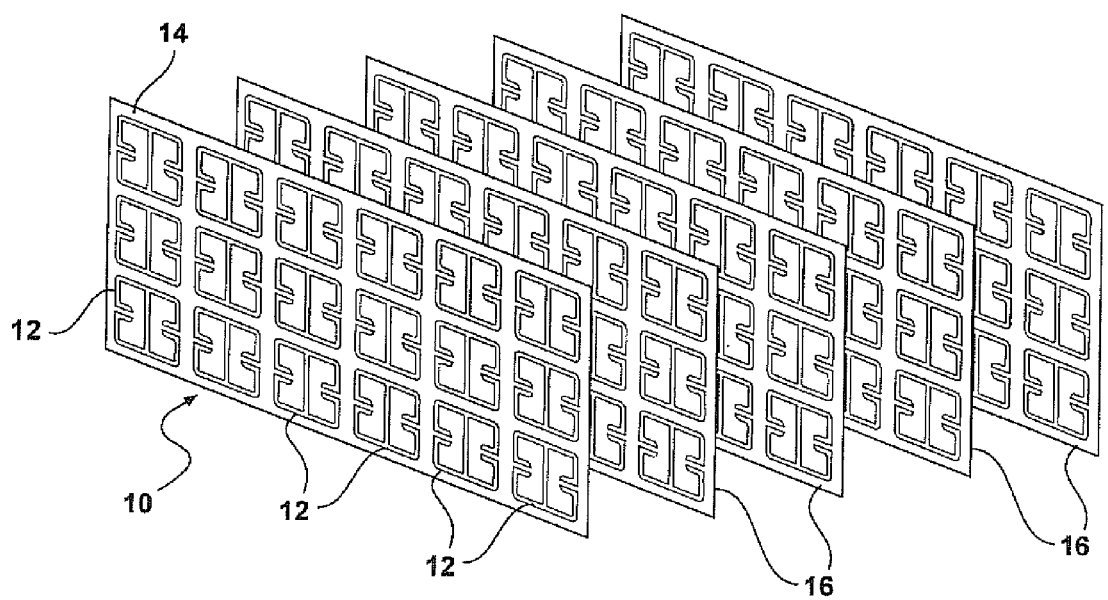
FIG - 1A      *PRIOR ART*
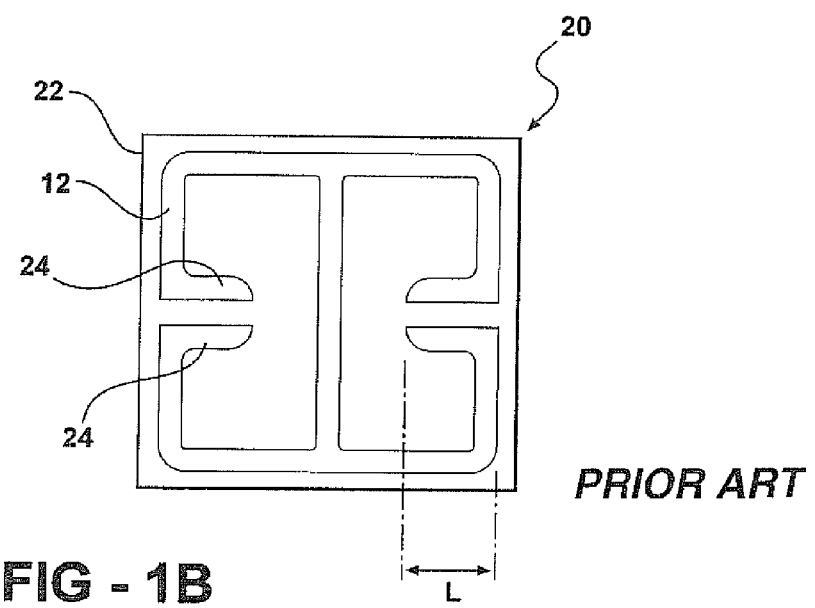
FIG - 1B      *PRIOR ART*

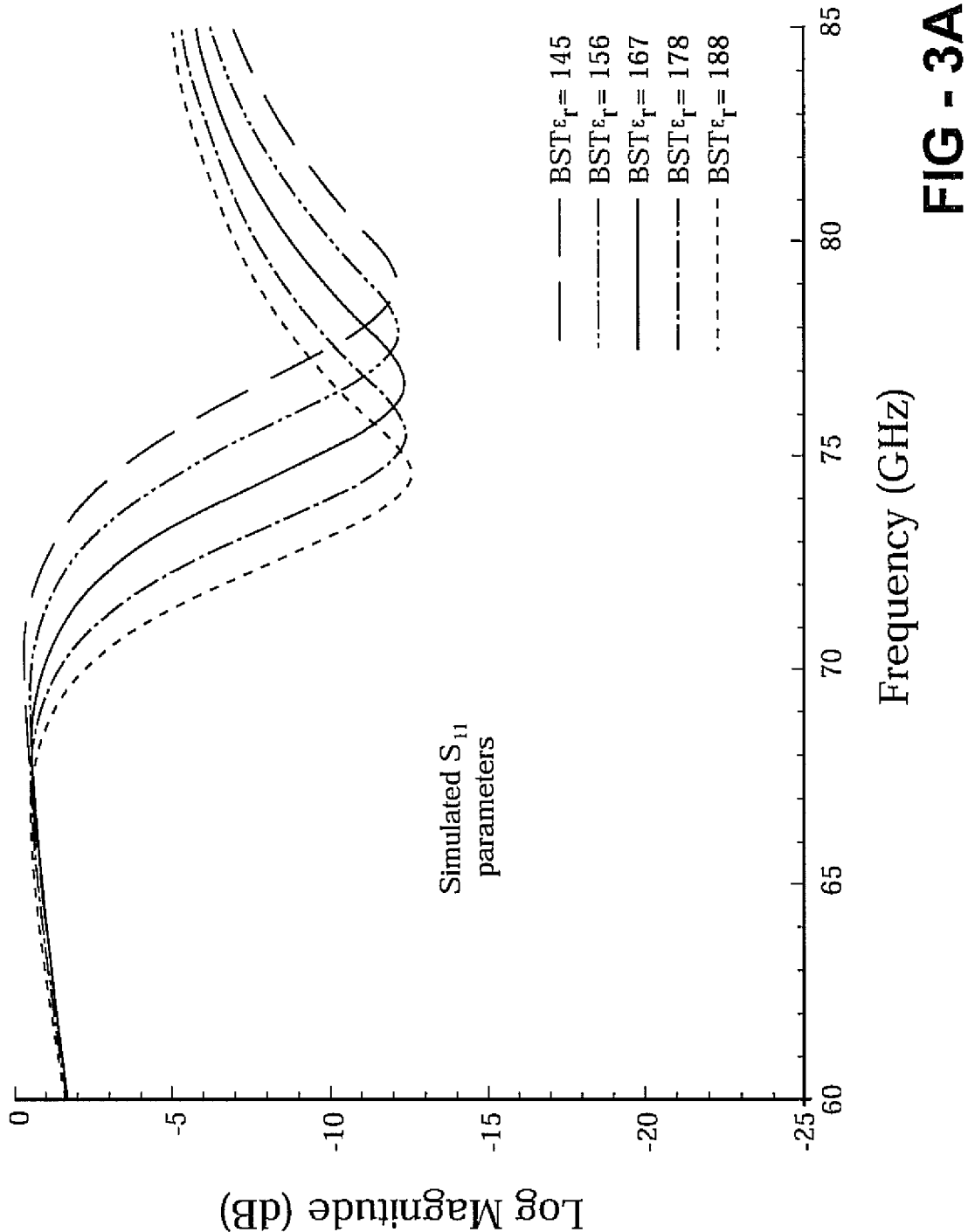

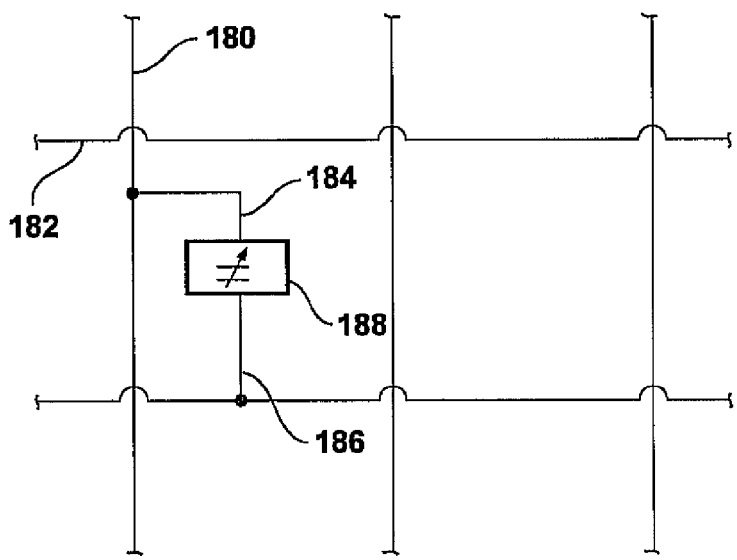
FIG - 6A
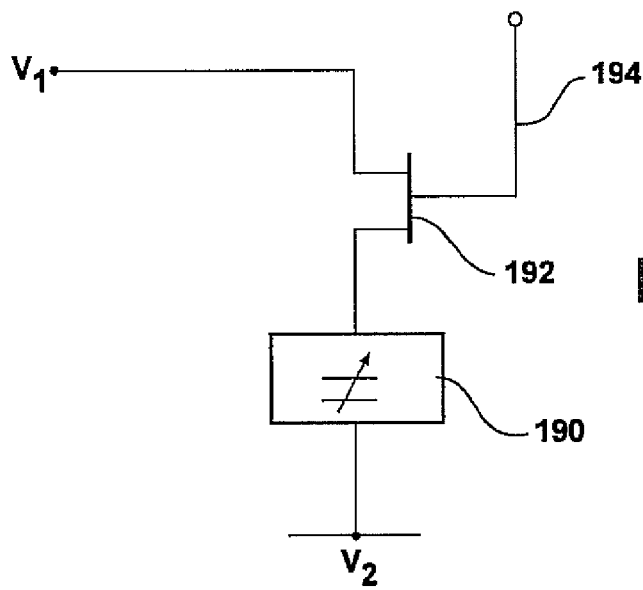
FIG - 6B
FIG - 8
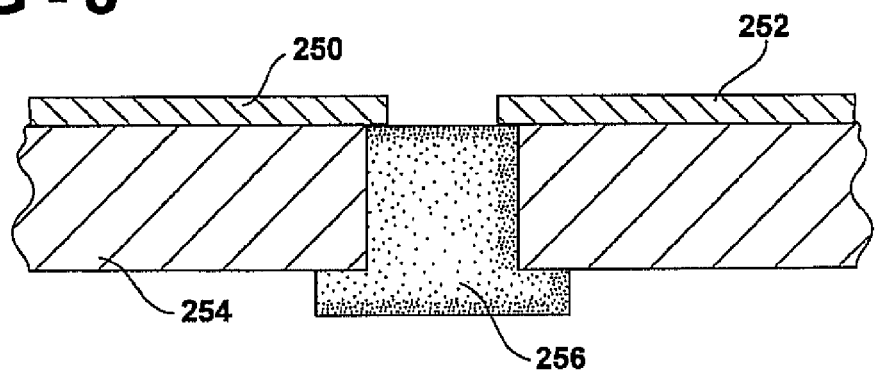

TUNABLE METAMATERIALS

FIELD OF THE INVENTION

The invention relates to metamaterials, in particular metamaterials having tunable electromagnetic properties.

BACKGROUND OF THE INVENTION

An example metamaterial is a composite material having an artificial structure that can be tailored to obtain desired electromagnetic properties. A metamaterial may comprise a repeated unit cell structure. A typical unit cell comprises an electrically conducting pattern formed on an electrically non-conducting (dielectric) substrate.

The electromagnetic response of a metamaterial may be controlled using different parameters associated with a unit cell. For example, parameters may include unit cell dimensions, shape and size of conducting patterns therein, and the like. Hence, a metamaterial can be manufactured having a desired electromagnetic property at a particular operating frequency.

However, it would be extremely useful to adjust the properties of a metamaterial dynamically, so that electromagnetic properties may be adjusted during use of the metamaterial.

SUMMARY OF THE INVENTION

Embodiments of the present invention include metamaterials having an electromagnetic property that may be dynamically adjusted using a control signal. The control signal may be an electrical control signal, for example using a variable electric field to adjust the permittivity of a tunable material. Example metamaterials according to the present invention include at least one unit cell including a tunable material, such as a ferroelectric or phase change material. An example ferroelectric is barium strontium titanate. Example phase change materials include chalcogenide phase change materials. In some examples, the permittivity of a tunable material may be an average over a non-homogeneous tunable material, for example one including a mixed phase or domain structure.

An example metamaterial comprises a plurality of unit cells, at least one unit cell including an electrically conducting pattern ("conducting pattern") and a tunable material. The conducting pattern and tunable material together provide a resonant circuit. Tunable materials include materials having a permittivity that can be adjusted through application of control signals. For example, the permittivity of a ferroelectric material may be a function of applied voltage. The properties of the tunable material may be adjusted using a control signal to adjust the electromagnetic properties of the unit cell, such as resonance frequency, and hence of the metamaterial.

An example metamaterial may further comprise a support medium, such as a substrate, such as a glass, plastic, ceramic, other dielectric, or other support medium. The support medium may be a dielectric substrate in the form of a sheet, such as a polymer substrate. In some examples, free-standing or otherwise supported wire forms may be used to obtain conducting patterns. A dielectric substrate may be a rigid planar form, may be flexible yet configured to be substantially planar, or in other examples may be flexible.

A unit cell may comprise a conducting pattern having a tunable material located between first and second conducting segments, the tunable material having an adjustable permittivity. Example conducting patterns include electrically-coupled LC resonators and the like.

In some examples, a unit cell includes a conducting pattern which may include one or more capacitive gaps. A capacitive gap may be formed as a physical separation between first and second segments of the pattern. In some examples, the gap may be formed as a spacing apart of coplanar elements, for example printed conductors on a dielectric substrate in the manner of a printed circuit board. In other examples, a gap may be formed in whole or in part between overlapping portions of conducting segments. In other examples, interdigitated forms may be used, interdigitation between electrodes being in the plane of the substrate or in a plane normal to the substrate. A tunable material may be located at least partially within, or proximate to, a capacitive gap within an LC resonator (such as a split-ring LC resonator) or other conducting pattern.

In some examples of the present invention, a tunable material is located within a capacitive gap of a conducting pattern. A control signal is applied to the tunable material so as to adjust one or more electrical or electromagnetic parameters, for example allowing gap capacitance to be dynamically adjusted. For example, an electric field may be used to adjust the permittivity of a ferroelectric material, allowing dynamic adjustment of a gap capacitance including such a ferroelectric material. In other examples, some other field such as a magnetic field, electromagnetic radiation field such as a laser, or other field may be used to modify the properties of the tunable material.

In some examples, the tunable material may have a permittivity that is correlated with an applied electric field. Examples include ferroelectric materials, such as barium strontium titanate. In this context, the term ferroelectric material refers to a material having a ferroelectric phase though the tunable material may use another phase of the material, such as a lower temperature paraelectric or dielectric phase. Example tunable materials also include phase change materials.

Electrodes may be provided to apply an electric field over some or all of the tunable material. In some examples, the electrodes are provided by the pattern, for example using one or more segments of the pattern to apply an electric field to the tunable material. In other examples, electrodes may be separate elements from the pattern, but may slightly modify the electromagnetic properties of the metamaterial.

Examples of phase change materials include materials that convert from a first phase to a second phase, where the first phase is a crystalline phase and the second phase is an amorphous phase. Preferably, phase conversion is reversible, so a tunable material may be converted between first and second phases using a control signal. In some examples, the ratio of crystalline and amorphous forms may be adjusted using a control signal, allowing variation of an electromagnetic property such as permittivity. The permittivity of a phase change tunable material may be adjusted using an applied electrical potential. In some cases, electrical control signals can be used to induce phase changes in a tunable material, or to adjust the ratio of a first phase to a second phase.

For example, chalcogenide phase change materials have different permittivities in amorphous and crystalline states, and the electromagnetic response of a unit cell, and a metamaterial including the unit cell, can be modified by changing the phase of a phase change tunable material within one or more unit cells of the metamaterial.

Example phase change materials include chalcogenides including at least one chalcogen as a component, such as compounds of sulfur, selenium, or tellurium. Examples include compounds of germanium, antimony and tellurium such as $Ge_2Sb_2Te_5$ and antimony-selenium compounds such as $SbSe_x$.

In some examples, the phase change material may remain in a certain phase state, such as crystalline, amorphous or mixed phase state, until another control input is used to modify the phase state. Hence, a metamaterial including a phase change material may be reconfigured using a control signal, and then remain in the new configuration until a further control signal is received. In other examples, the permittivity of a phase change tunable material is a function of applied electrical potential, and can be adjusted continuously.

Electrical control signals may be used to modify properties of tunable materials, and hence a metamaterial including such tunable materials. The permittivity of a ferroelectric material may be changed as a function of an applied electric field, for example the permittivity being a continuous function of electrical field. In some examples of using phase change materials, an electrical input may be used to heat the phase change material, allowing a controlled cooling rate to select a desired final phase. For example, the cooling rate may be controlled by an applied electric field, for example using a controlled rate of decrease of electric field to slowly or otherwise controllably cool the tunable material. In other examples using phase change materials, the composition of a mixed phase state may be adjusted continuously using an electrical potential, allowing electrical control of the permittivity.

Electrodes may be provided to allow application of control signals to the tunable materials. These electrodes may be part of the electrically conducting pattern, or may be separate electrodes.

Metamaterials according to examples of the present invention may be used for control of electromagnetic radiation. Example applications include lenses (including gradient index lenses), beam steering devices such as may be used in an automotive radar system, and the like.

BRIEF DESCRIPTION OF THE DRAWINGS

FIGS. 1A-1B illustrate an example unit cell configuration for a metamaterial;

FIG. 3A shows simulated $S_{11}$ parameters for a metamaterial as a function of operational frequency and permittivity of a tunable material;

FIGS. 6A-6B show application of a control signal to a tunable material;

FIG. 8 illustrates a tunable material within a substrate.

DETAILED DESCRIPTION OF THE PREFERRED EMBODIMENTS

Figure 1C:
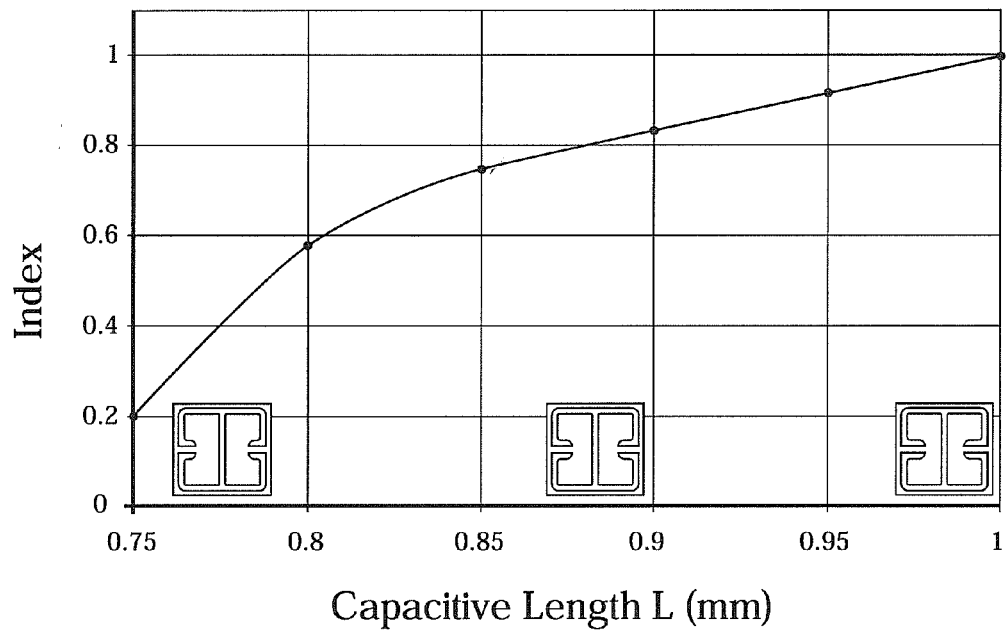
FIG. 1C illustrates index variation versus unit cell capacitance.

A metamaterial according to an example of the present invention is an artificially structured composite material including a plurality of resonant circuits. Each resonant circuit includes an electrically conducting pattern. At least one resonant circuit includes a material having an adjustable permittivity, allowing the electromagnetic response of the resonant circuit to be modified. An example metamaterial may comprise a repeated unit cell structure, each unit cell comprising an electrically conducting pattern supported by a dielectric substrate. An example electrically conducting pattern may be an electrically-coupled LC resonator, or other electrically conducting pattern including a capacitive gap between conducting regions. The tunable material may be located partially or wholly within, or proximate to, the capacitive gap.

Examples of the present material include a tunable metamaterial unit cell. A tunable unit cell may be created by placing a tunable material within a capacitive gap of the unit cell. Tunable materials include phase change materials, ferroelectric materials, and other materials in which the permittivity may be adjusted using an external signal. For example, the properties of a phase change material can be controlled by applying a bias voltage. A bias voltage can be applied individually to each unit cell or to groups (rows, columns, subsections) as needed to make a reconfigurable metamaterial optic for beam formation or beam steering. A phase change material may be, for example, selected from chalcogenides which undergo a phase change upon application of a bias voltage. Some chalcogenides have the ability to reversibly change between an amorphous phase and a crystalline phase and/or different phases in between based (such as mixed amorphous-crystalline phases) on the application of such voltages. Other materials having similar properties that may be used in accordance with the present invention include ferroelectric materials such as barium strontium titanate.

In contrast, a metamaterial element including only non-tunable resonant circuits has electromagnetic properties determined by fabrication parameters such as the length of the capacitive gap. In conventional devices, these parameters cannot be changed after fabrication is complete. However, some examples of the present invention include metamaterials having spatial variation of fabricated unit cell parameters and combined with tunable unit cells.

FIG. 1A illustrates a conventional metamaterial 10, comprising at least one substrate 14 on which a plurality of conducting patterns 12 are disposed. In this example, a plurality of substrates are used, the additional substrates 16 being generally parallel to substrate 14 and spaced apart. In this figure, the spacing is exaggerated for illustrative clarity.

FIG. 1B shows a conventional unit cell including an electrically-coupled LC resonator pattern which may be used in a metamaterial. The unit cell shown generally at 20 includes conducting pattern 12, having the same form as shown in FIG. 1A. A capacitive gap is formed by capacitive pads 24 having a pad length. In this example, the pad length has the same value for both capacitive gaps. The periphery of the unit cell 22 need not correspond to any physical structure, the dimensions being related to the pattern repeat on the substrate surface. In this example, the pad length is a feature length L, variation of which allows index to be varied.

A conventional metamaterial includes a repeating pattern having constant values of pad lengths. The properties of the metamaterial are related to parameters of the unit cell, such as the pad length. The unit cell of a metamaterial includes a conducting pattern, in this example an electrically-coupled LC configuration having inductive and capacitive components. As shown, the index of a metamaterial is a function of the capacitive component. One approach is to vary the capacitive pad length, but this approach is limited by the physical limits to size variation.

FIG. 1C shows how the index of a metamaterial may vary with a capacitance, in this example as a function of capacitive pad length. The index is lower for shorter values of pad length, such as shown at the left, and greater for larger values of pad length, for example as shown at the right. Curves such these may be readily determined experimentally or using a simulation. The feature length/index curve shows the relationship between the index n(r) and a feature length L. The index can only vary within an available index range limited by the range of values of L. A desired index curve can be used to design a conventional gradient index lens, but constraints on available index range conventionally place severe limitations on any such lens design.

Figure 1D:
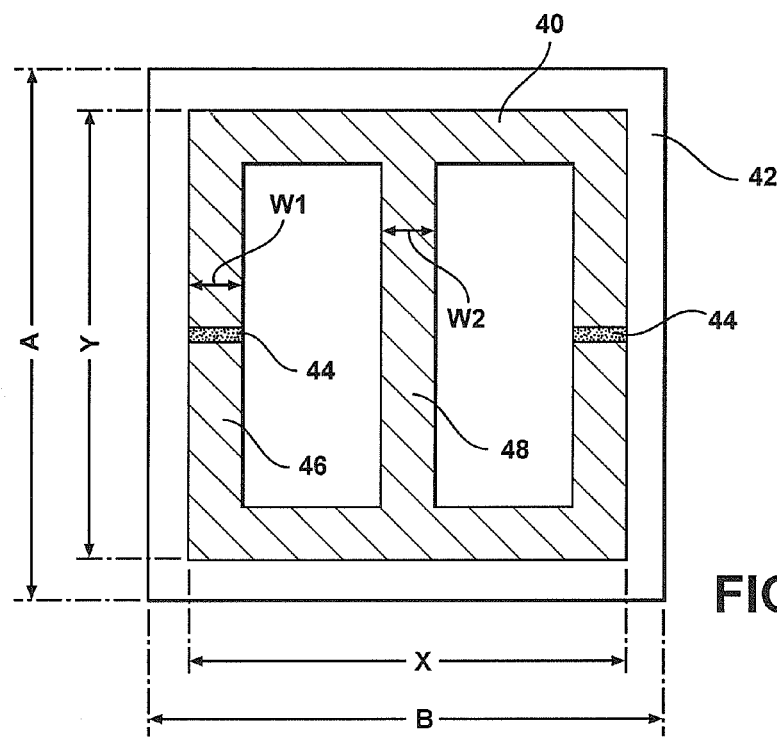
FIGS. 1D-1G further illustrate unit cell parameters.

FIG. 1D illustrates various unit cell parameters for a possible unit cell, including a conducting pattern 40 supported by substrate 42, the conducting pattern having capacitive gaps shown at 44. The figure shows unit cell dimensions (A and B), conducting pattern dimensions (X and Y), and track widths such as $W_1$ and $W_2$ for side conducting segment 46 and central conducting segment 48 respectively. This example shows an effective capacitive pad length at capacitive gap 44 equal to the track width W1 of conducting segment 46.

In embodiments of the present invention, the capacitive gaps 44 each include a tunable material, such as a ferroelectric material or a phase change material, and an electrical control signal applied to the tunable materials allows the properties of the unit cell, and hence of a metamaterial including a plurality of such unit cells, to be adjusted.

Figure 1E:
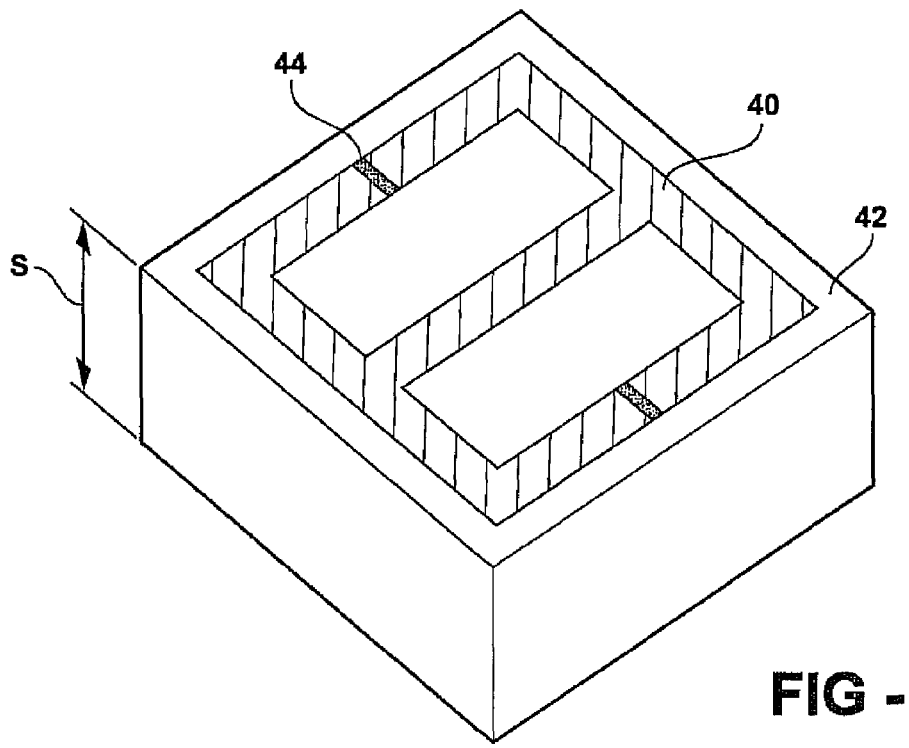

FIG. 1E illustrates substrate thickness, S, of substrate 42. This view includes the substrate, with substrate thickness S substantially greater than that of the conducting pattern disposed thereon. Typically, the substrate extends under or otherwise supports a plurality of unit cells, and this illustration suggesting that the substrate is a rectangular block limited to a single unit cell is for illustrative purposes only.

Electromagnetic properties of a metamaterial including a plurality of such unit cells depend on various parameters, such as unit cell dimensions (A, B); outside dimensions of the conducting pattern (X, Y); capacitance of capacitive gaps; overall shape of the conducting pattern (such as an LC resonator, and the like); width of conducting segments such as the width of outer segments and/or of a central segment, and substrate properties and thickness.

A metamaterial may comprise a plurality of unit cells, which may be arranged in a regular array. The array may be a square array, for example if A=B. The dimensions of the unit cell are typically correlated to the repeat distances of conducting patterns on a substrate. Conducting patterns may be arranged in other array forms, such as hexagonal arrays, in which case unit cells may be polygons, for example regular polygons.

Additional variations of unit cell properties, and those of a metamaterial comprising such unit cells, may be obtained by varying unit cell parameters such as capacitance of a capacitive gap. This may be combined with other approaches, such as variations in other parameters such as track widths, corner radius, and the like.

In examples of the present invention, a tunable material is provided in one or more capacitive gap of the unit cell. For example, the tunable material may be a dielectric material having a voltage-tunable permittivity. For example, a capacitive gap (such as shown at 44 in FIG. 1D) may include a variable capacitor comprising an electrically tunable material, such as a variable permittivity material, or other variable capacitor such as a varactor diode. Other approaches are possible.

Figure 1F:
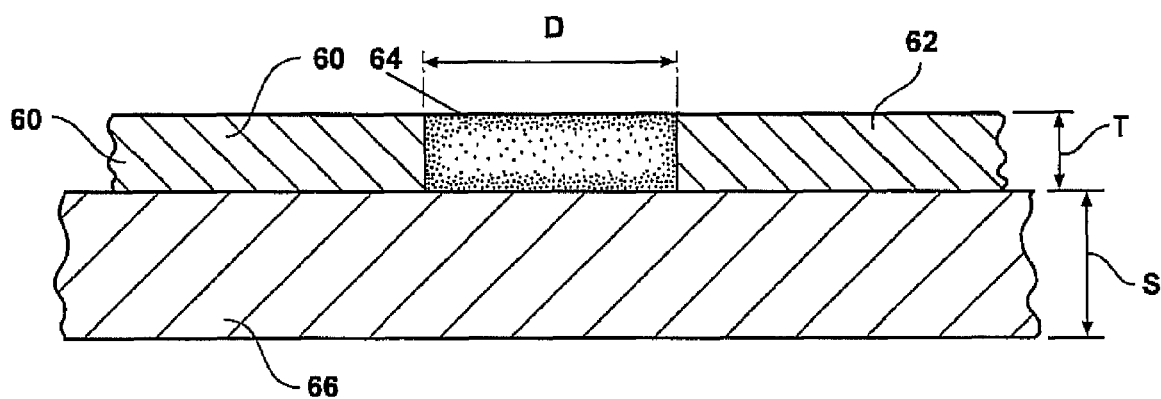

FIG. 1F shows a cross section through a capacitive gap, showing a tunable material 64 located within the capacitive gap between conducting segments 60 and 62. The capacitive gap has a gap width D; the metal of the conducting patterns has a thickness T, and the substrate 66 has a thickness S. Typically, S is greater than T.

Figure 1G:
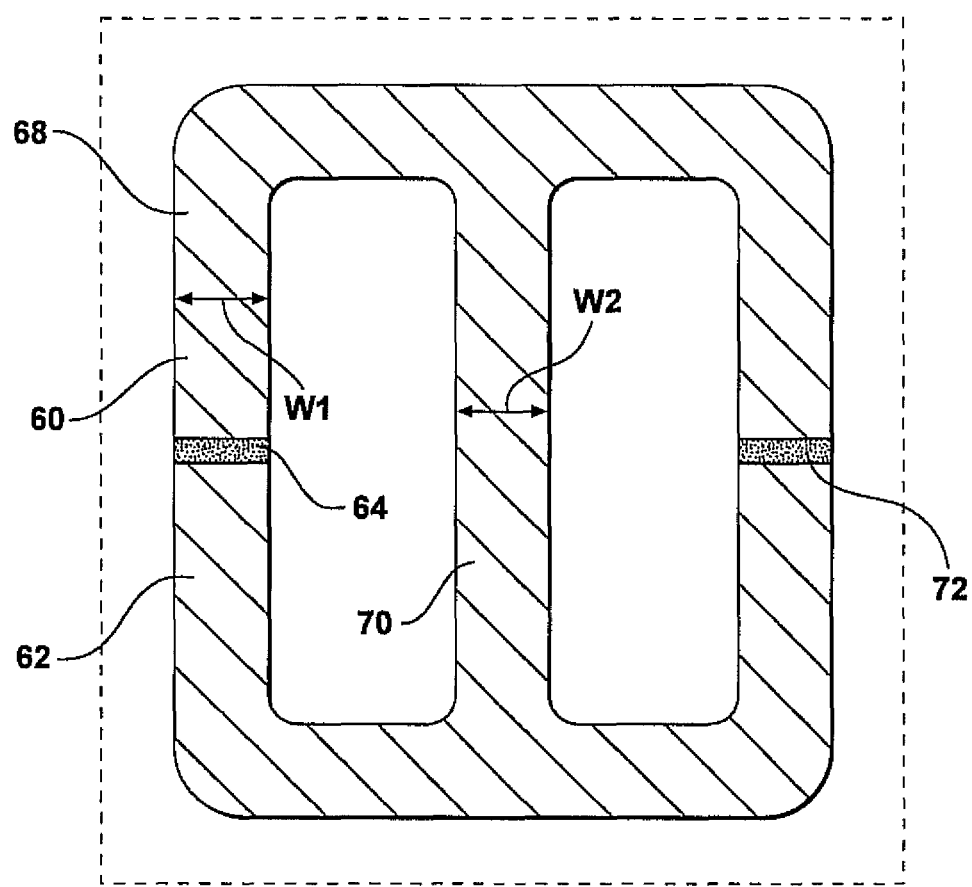

FIG. 1G illustrates a configuration having rounded corners 68, with conducting segments 60 and 62 (as shown in cross-section in FIG. 1F), tunable materials 64 and 72 located within capacitive gaps, and central conducting segment 70. The rounding of the corners 68, for example through adjustment of the corner radius, can be used to modify the electromagnetic response.

Figure 2:
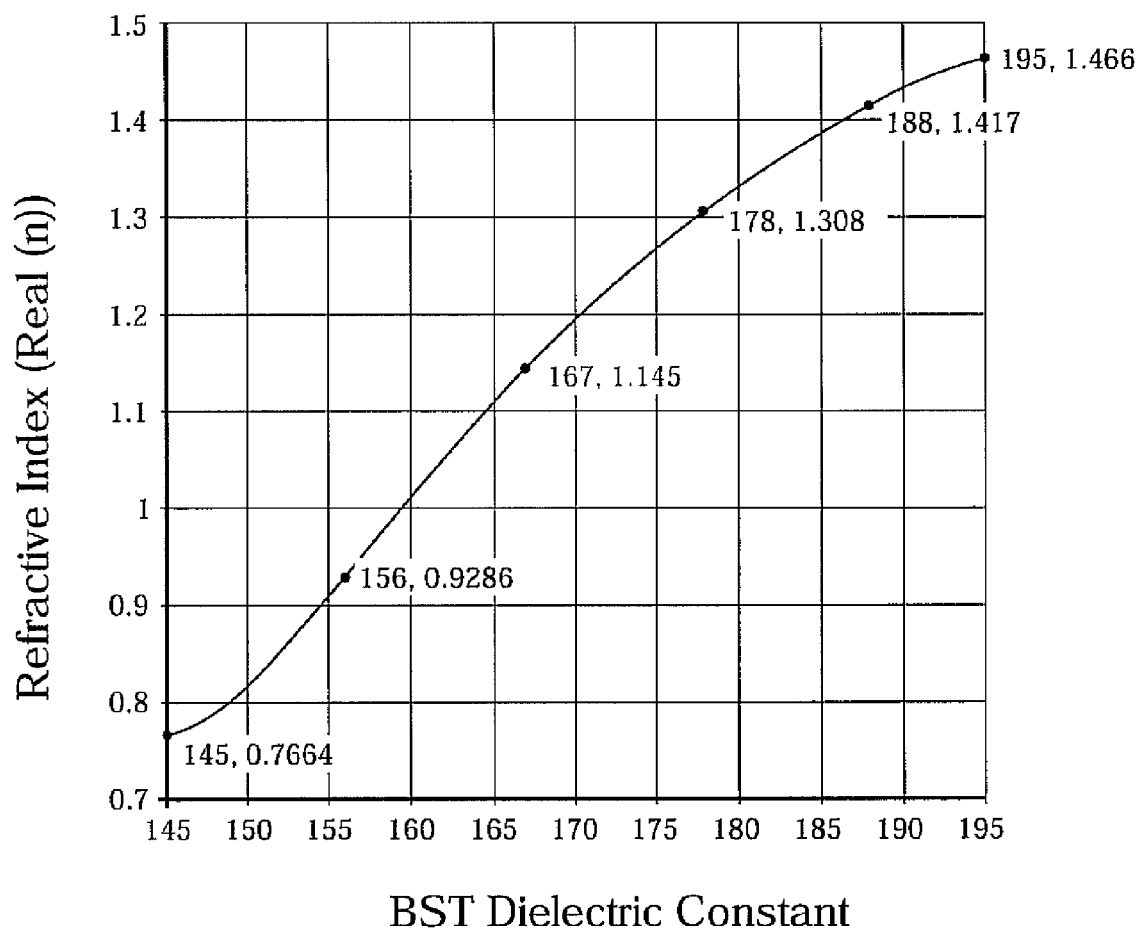
FIG. 2 shows the index of an example metamaterial as a function of the ferroelectric dielectric constant.

FIG. 2 shows the index of an example simulated metamaterial as a function of the ferroelectric material dielectric constant at 76.5 gigahertz. In this example, the tunable material used was barium strontium titanate (BST). This example metamaterial was simulated having a unit cell structure similar to that shown in FIGS. 1D-1E. In this example, $W_1=W_2=40$ microns, X=Y=340 microns, A=B=400 microns, the metal used for the conducting pattern was gold having a thickness T of 0.5 microns, the substrate was Pyrex 7740 having a substrate thickness S=200 microns, and the capacitance gap widths (D) were both 7 microns. However, it should be understood that these dimensions are exemplary and the invention is not limited to any particular example described herein.

Table I below shows the effect of bias voltage (applied as an electrical control signal) on unit cell permittivity and permeability.

TABLE I

| Bias voltage (V) | BST $\epsilon_r$ | Unit cell Real {$\epsilon_r$} | Unit cell Real {$\mu_r$} |
|---|---|---|---|
| 0 | 195 | 2.191 | 0.9622 |
| 2.5 | 188 | 2.032 | 0.9617 |
| 5 | 178 | 1.697 | 0.9547 |
| 7.5 | 167 | 1.233 | 0.9322 |
| 10 | 156 | 0.6103 | 0.8844 |
| 12.5 | 145 | −0.1224 | 0.8177 |

Table I illustrates the tunability of metamaterial real permittivity and real permeability as a function of electrical potential applied across a BST (barium strontium titanate) tunable material.

FIG. 3A shows simulated S-parameters for a simulated metamaterial including a plurality of unit cells such as discussed above in relation to FIG. 2. This graph shows the log as a magnitude $S_{11}$ as a function of electromagnetic frequency in gigahertz. Results are shown for different values of BST permittivity.

Figure 3B:
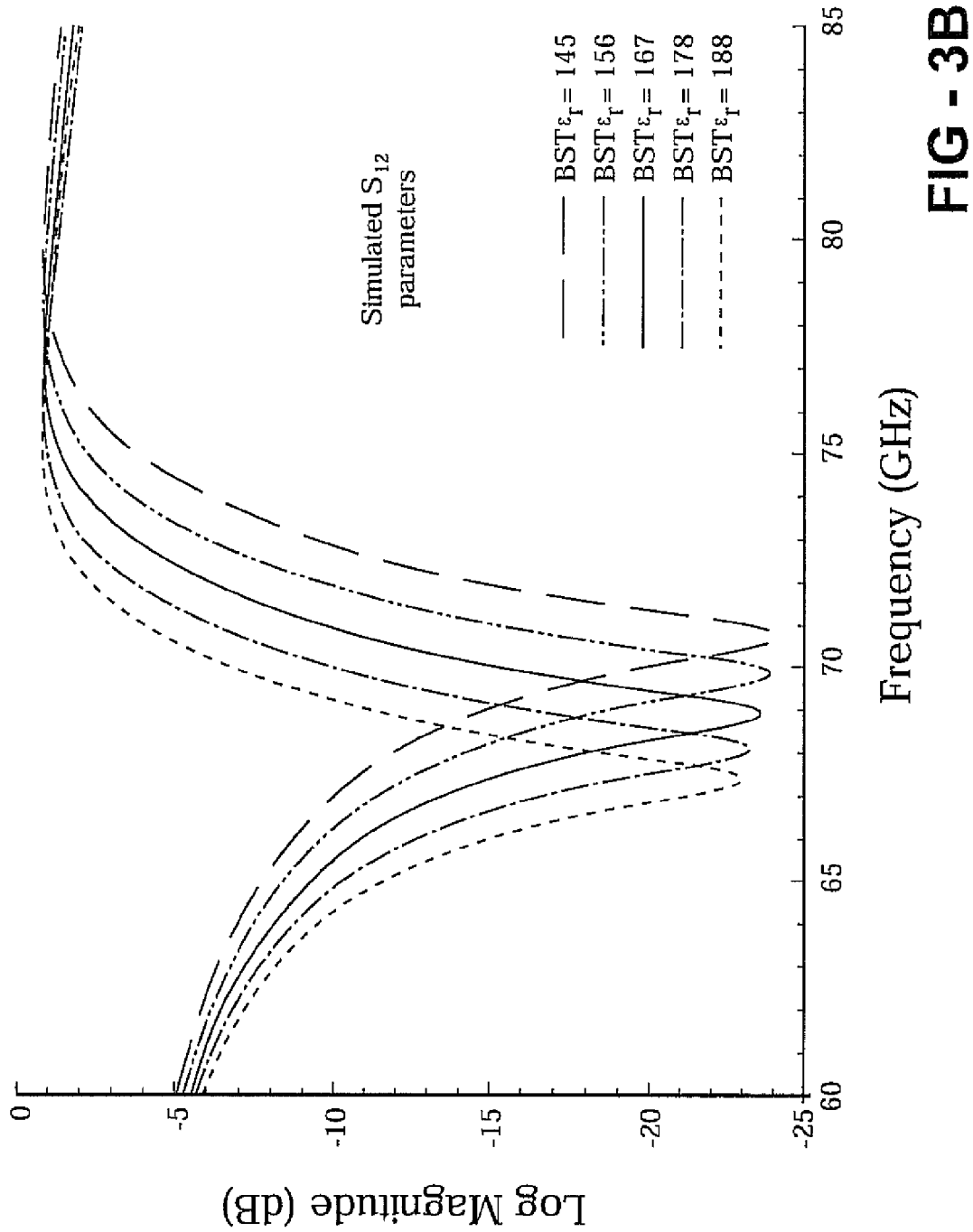
FIG. 3B shows $S_{21}$ parameters for a metamaterial as a function of operational frequency and permittivity of a tunable material.

FIG. 3B shows further simulations of the $S_{21}$ parameter, the graph showing the log of the magnitude of transmission. The graph shows data as a function of electromagnetic frequency in gigahertz, and also for different values of BST permittivity.

Figure 4A:
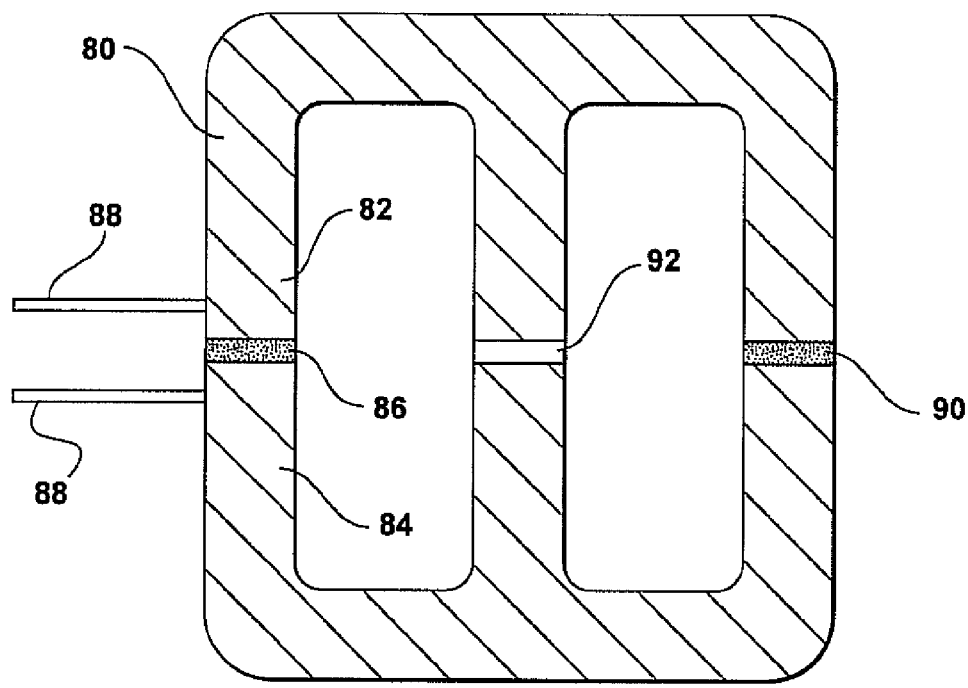
FIGS. 4A and 4B illustrate approaches to application of an electrical control signal to a tunable material associated with a conducting pattern.

FIG. 4A shows an example conducting pattern shown generally at 80 having a first conducting segment 82, a second conducting segment 84, and a tunable material 86 between the two conducting segments, in one of the three capacitive gaps of this conducting pattern (the other conducting gaps being at 90 and 92). Electrode connections 88 are used to apply an electrical control signal across the tunable material.

Figure 4B:
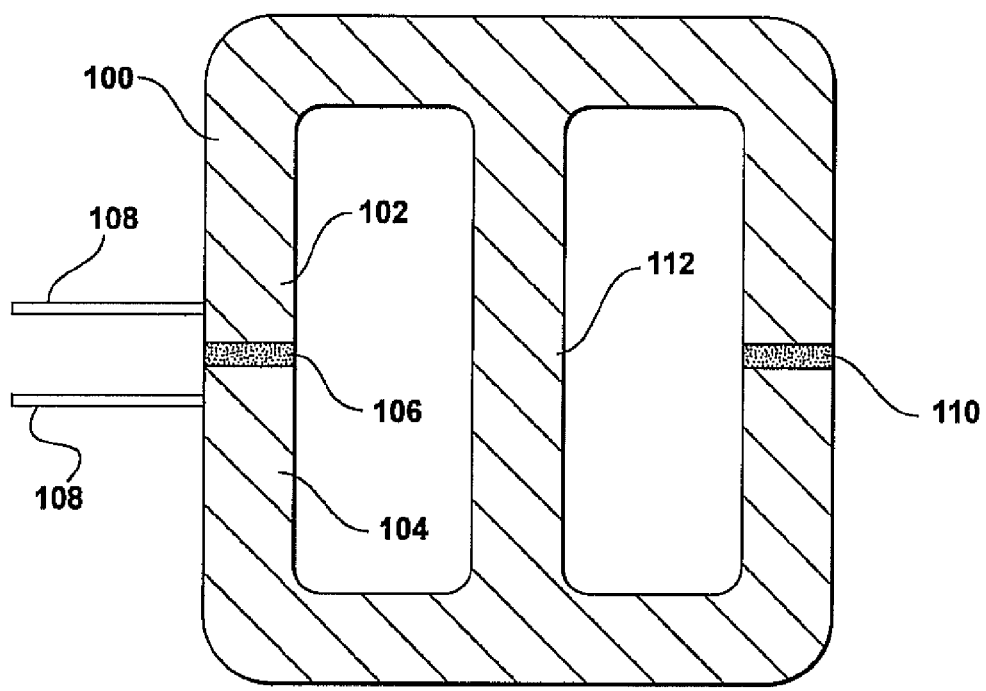

FIG. 4B shows a similar configuration, with conducting pattern 100 comprising first and second conducting segments 102 and 104, a tunable material 106 in the conducting gap therebetween, and second conducting gap 110. Electrical connections 108 are used to apply an electrical control signal across the tunable material.

In examples of the present invention tunable materials may be included in one or more capacitive gaps. Application of a control signal, in this case an electric signal, between the first and second segment can be used to vary the permittivity of the tunable material. An example metamaterial may include a plurality of resonant circuits formed from such conducting patterns and associated tunable materials.

In the example of FIG. 4B, it would initially appear that no control signal can be usefully applied across the tunable material 106 due to the conducting segment 112 electrically interconnecting segments 102 and 104. However, at the fabrication scales which may be used, in particular for radar, IR, and optical applications, this electrical interconnection may have significant impedance, depending on the film thickness, control signal frequency, and the like. Hence, it is possible to modify the permittivity of an electrically tunable dielectric material through application of an alternating field to electrical connections 108. Electrical connections may comprise printed conducting tracks on a substrate, wires, vias, and the like.

An electronic control signal may be applied through local electrical connections as shown, and possibly using matrix addressing schemes. The conducting path of a general resonant structure configuration may, for alternating applied voltages having a control voltage frequency ($f_{app}$), provide significant impedance to the applied field due to capacitive and self-inductive components. Hence, an alternative electric field may be applied to a tunable material such as a ferroelectric or phase change material. The field strength may be enhanced by the small physical dimension of the capacitive gap, for a given applied voltage.

FIGS. 5A-5G illustrate alternative possible configurations of a capacitive gap within a conducting pattern. However, the present invention is not limited to such specific examples.

Figure 5A:
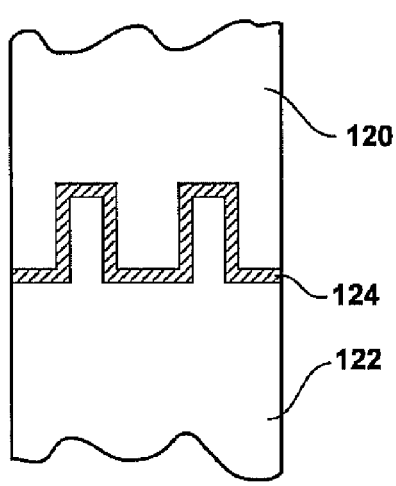
FIGS. 5A-5G show various possible configurations of a capacitive gap within a conducting pattern.

FIG. 5A shows a configuration in which a tunable material 124 is located within a capacitive gap between conducting segments 120 and 122. The capacitive gap has a castellated structure due to interdigitation of the electrodes.

Figure 5B:
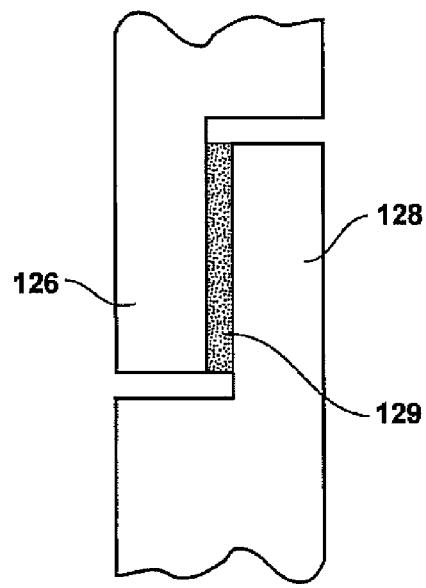

FIG. 5B shows first and second conducting segments 126 and 128 having a tunable material in a gap therebetween, the tunable material 129 being located within the gap so that an electric field is normal to the direction of elongation of the conducting segments. The tunable material extends in the direction of elongation of the conducting segments, and the tunable material is located as a thin strip between the two segments.

Figure 5C:
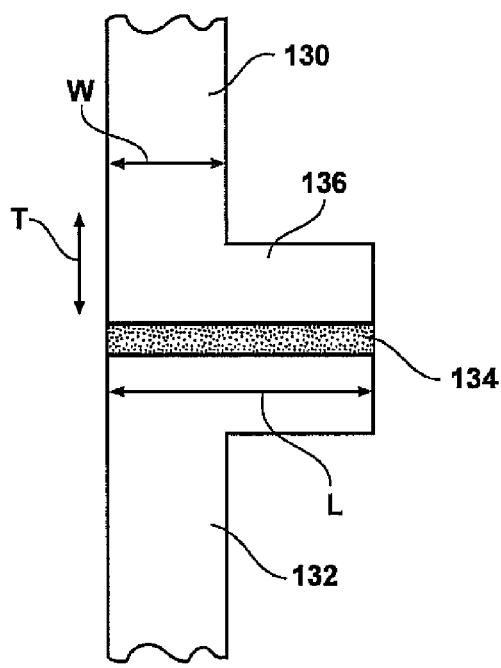

FIG. 5C shows first and second segments 130 and 132 having a broadening 134 proximate to the gap including the tunable material 136. As shown, the first segment has a width W within a generally extended portion, and the broadened region has a width L and an extent normal to the width T. In this example, L may be at least twice W, and T may be approximately equal to W. However this example is not limiting.

Figure 5D:
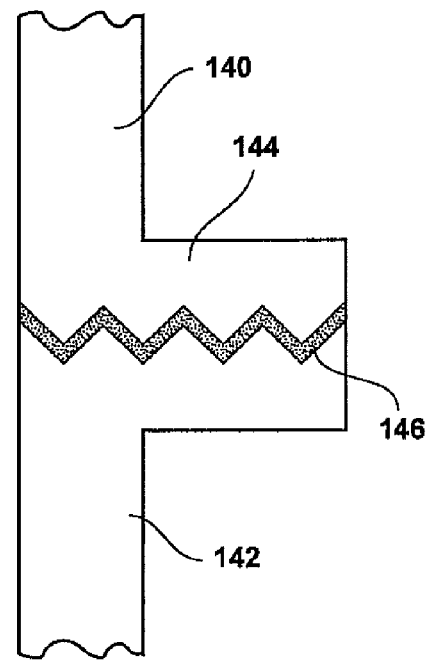

FIG. 5D shows a combination of broadening 144 and interdigitated gap 146 between first and second segments 140 and 142 respectively. An interdigitated gap may alternatively have a generally squarewave-like form, or other form such as sinusoidal, triangular, or some combination thereof.

Figure 5E:
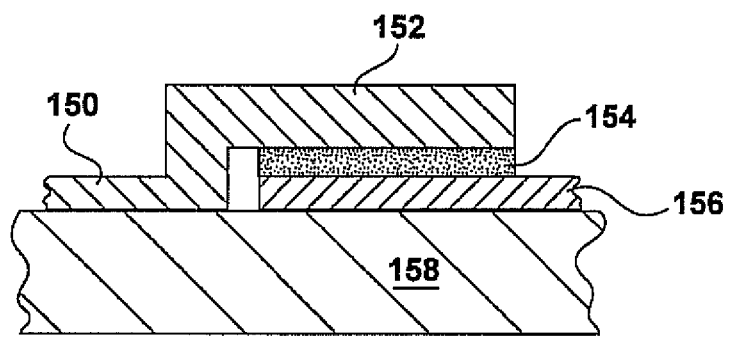

FIG. 5E shows a somewhat different configuration in which first and second segments 150 and 156 have a partially overlapping structure provided by overlapping region 152. In this example, the tunable material 154 is located between 152 and 156. The figure also shows substrate 158. In this example, the tunable material may be controlled by an electric field that is generally normal to the substrate surface. Hence, the capacitance of a capacitive gap may include contributions from proximate edges and/or overlapping portions of pattern segments.

Figure 5F:
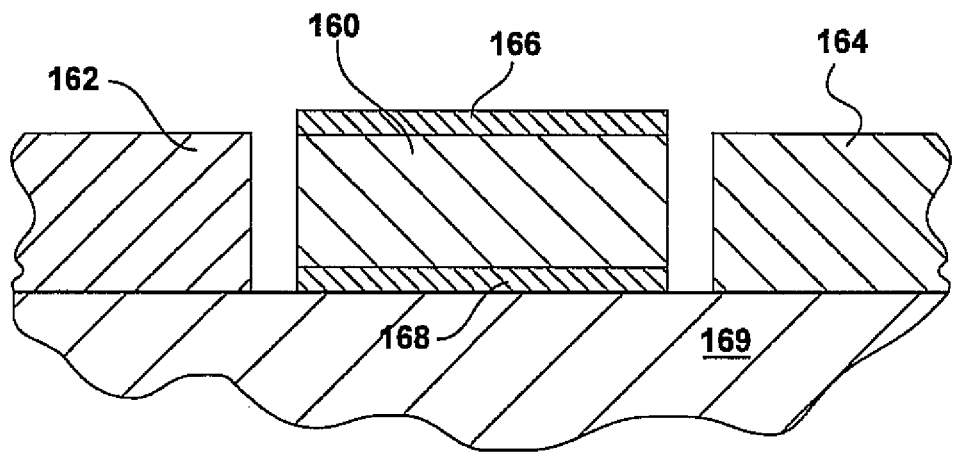

FIG. 5F shows a cross section view of an example in which the electrodes are disposed at 166 and 168 above and below the tunable material that is located within a gap between first and second segments 162 and 164. The permittivity of the tunable material 160 may be controlled using a control signal applied to electrodes 166 and 168. The substrate is shown at 169.

Figure 5G:
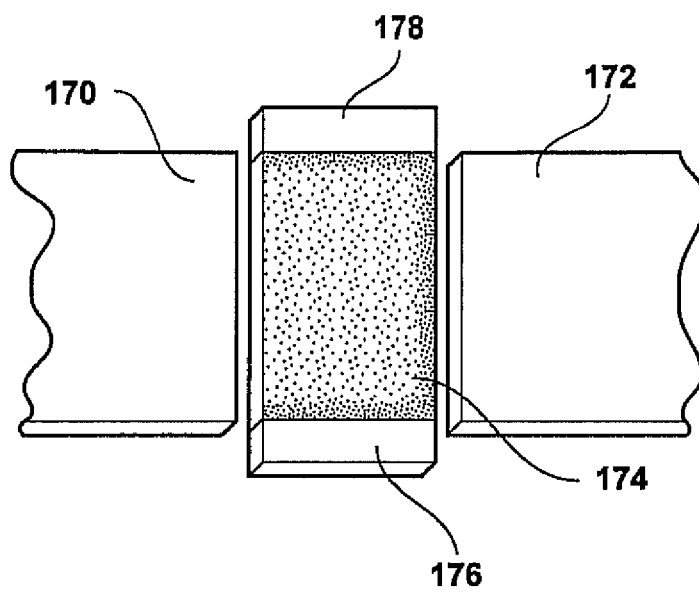

FIG. 5G shows a top view of an example in which tunable material 174 is located between conducting segments 170 and 172, electrodes at 178 and 176 being used to apply an electrical control signal to the tunable material.

Other configurations of capacitive gap are possible. For example, first and second segments may have interdigitation in a plane normal to the substrate. Such a structure may have a multilayer structure, for example comprising a plurality of tunable material films between interdigitated electrodes. In other examples the tunable material may be part of a capacitive structure such as a spiral which may then be located on a metamaterial substrate.

Addressing schemes include direct drive and matrix addressing schemes comparable to those used in liquid crystal displays. There may be averaging of applied electric potential over several frame times. Electrical switches may also be used to control signals applied to the tunable material. An example electrical addressing scheme may include column electrodes, row electrodes, and local connections from row and/or column electrodes to a tunable element. The tunable element may be a capacitive gap including a tunable material. Local connections may be made to electrodes used to apply a control signal to the tunable material. Application of a control signal may use local electrical switches, or direct drive techniques may be used.

FIG. 6A shows a voltage tunable element 188 connected by local electrical connections 184 and 186 to row and column electrodes 182 and 180, respectively. Matrix addressing techniques may be used to vary the electrical potential across the tunable element.

FIG. 6B shows a switch 192, in this example a field effect transistor, receiving a control signal from a column electrode 194 to the gate thereof allowing an electric field to be applied to a tunable material 190.

FIG. 7A-D illustrates aspects of an example electromagnetic control system according to some embodiments of the present invention.

Figure 7A:
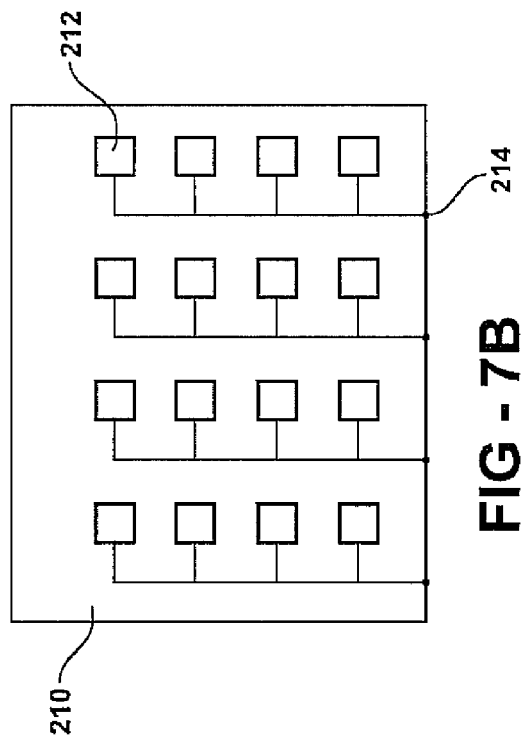
FIGS. 7A-7D show a control system according to an embodiment of the present invention.

FIG. 7A illustrates a conducting pattern, in this case an electrically-coupled LC resonator, schematically at 202, comprising first and second tunable elements 204 and 206 respectively controlled using a control signal applied through control electrodes 208. The resonator is one of a plurality of resonators present within a layer of the metamaterial.

Figure 7B:
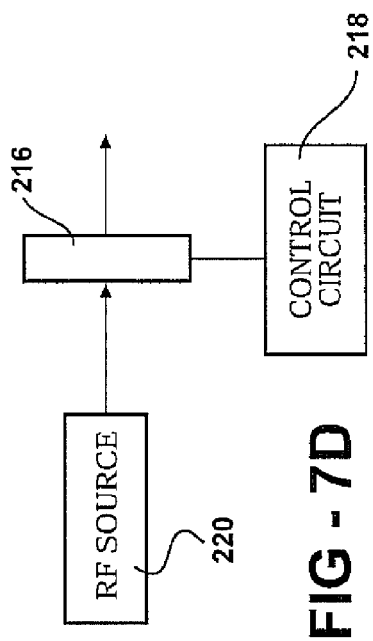

FIG. 7B shows a substrate 210 including a plurality of conducting patterns, each conducting pattern (such as shown in FIG. 7A) being represented by a box such as 212. This may form a single layer of a metamaterial, and further comprises associated drive circuitry for applying bias voltages to tunable elements associated with each conducting pattern. Hence, an example metamaterial according to the present invention includes a plurality of tunable unit cells, so that, for example, application of a spatially varying bias voltage leads to a correlated spatial variation of index within the metamaterial. In this case, metamaterial index can be varied spatially by applying different potentials to each column of conducting patterns through electrodes 214.

Figure 7C:
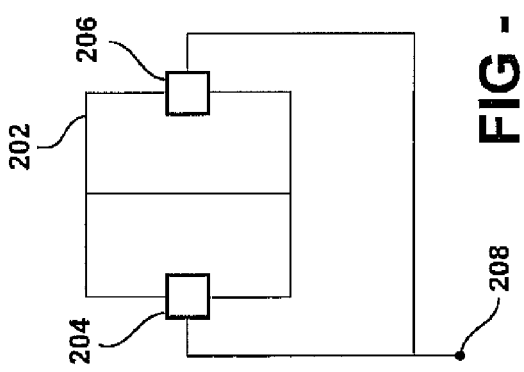

FIG. 7C shows schematically how index may vary with bias voltage. The variation may be linear or non-linear with spatial dimension, along one or two axes, or otherwise varied.

Figure 7D:
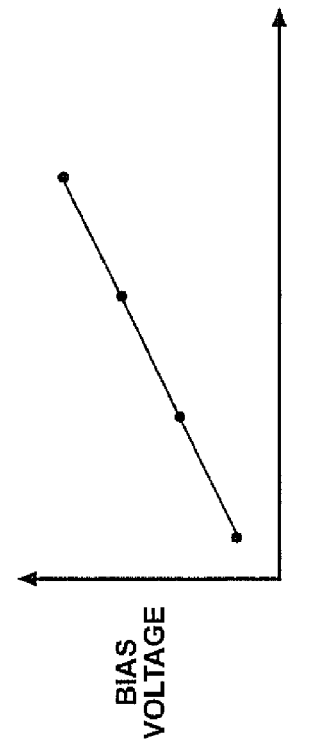

FIG. 7D shows a metamaterial lens 216 including one or more layers such as 210, with a control circuit 218 used to apply control signals to one or more of the layers. A radiation source 220 provides radiation passing through the metamaterial lens, and the beam properties of the emerging beam can be adjusted using the control circuit, providing an improved beam steering device. Examples of the present invention include refractive beam steering devices or other beam control devices. Other examples include reflective devices. An index gradient, and hence beam deflection angle, may be controlled by an electrical control signal applied to tunable materials with capacitive gaps of metamaterial unit cells.

In some examples, the permittivity of a tunable material may be controlled using electromagnetic radiation, such as thermal radiation, laser radiation (which may be used for heating), optical signals, etc. For example, electromagnetic radiation may be used to melt and cool phase change materials into a desired phase composition, and time-dependent intensity may be used to control the cooling rate from a melted state and hence composition.

FIG. 8 illustrates a substrate configuration including a tunable material. A tunable material 256 is present within the dielectric substrate material 254, and modifies the capacitance of the capacitive gap between first and second conducting segments 250 and 252 respectively.

In some embodiments of the present invention, a substrate has first and second faces, the conducting segments of the resonant circuit being supported on a first face. Electrical connections to tunable materials, including such configurations such as row and/or column electrodes may be formed on the second face. In some cases, electrodes may be formed on the second face, for example an electrode may be disposed on the lower face (as illustrated) of tunable material 256 shown in FIG. 8.

In some examples of the present invention, beam steering may be achieved using a variable bias voltage applied across the metamaterial, so as to provide a variable index or gradient index lens. A gradient index lens may be used to modify the direction of the emergent beam, and the beam may be scanned in one or more planes. Beam steering devices (or other beam control devices) may be refractive, the beam to be steered passing through the beam steering device, for example from one face to another. Such a configuration is useful for automotive applications, for example adaptive cruise control, parking assistance, hazard recognition systems, and the like. The loads in this example may be capacitive, or in other examples may be some combination such as a resistive load, capacitive load, inductive load or combination thereof such as RC, LC, RL, or RCL. In some examples, a ferroelectric material may provide a largely capacitive load. A phase change material may provide a capacitive load, or in some examples an RC load having a variable resistance.

The control signal may be the result of electric potentials applied to rows and columns, or in some examples may be as a result of a direct drive scheme in which a potential is directly applied relative to a grounded terminal. In some examples, a two-dimensional variation of effective index may be obtained. In other examples, rows and/or columns may be controlled en masse to obtain a variation in index in one direction, for example an index gradient in one direction. For the same device, it may only be able to obtain a gradient in one direction, for example applying signals to rows or columns and possibly the direction of the index variation may be switched to an orthogonal direction through control of columns.

Example metamaterials may comprise a single substrate supporting conducting patterns, or may be multilayered structure having a multiple substrates. A multilayer metamaterial may provide a three-dimensional arrangement of unit cells. In such examples it may be possible to obtain a 3D variation of index. Alternatively, variations in one or two directions may be obtained according to the desired application. Hence, using a tunable metamaterial unit cell, different metamaterial index values can be achieved by changing the effective capacitance component of the unit cell. A lens including tunable unit cells may have a focal length that is adjustable using the control signal.

In some examples, a metamaterial element may include one or more tunable metamaterial layers, with impedance matching layers on one or both sides thereof.

A tunable unit cell may be created by placing a tunable material between the capacitive gaps of the unit cells. For example the properties of a phase change material can be controlled by applying a bias voltage. A bias voltage may be applied individually to each unit cell or to groups such as rows, columns, or subsections as desired to make a reconfigurable optical element for beam formation or steering. Phase change materials may be chalcogenides which undergo a phase change upon application of a bias voltage. Chalcogenides may also have the ability to reversibly change between an amorphous phase and a crystalline phase and different or mixed phases therebetween based on the application of such control signals.

Ferroelectric Tunable Materials

An example ferroelectric tunable material is barium strontium titanate, which provides an electric field dependent permittivity. Hence the permittivity may be adjusted using an electrical control signal. Advantages of some of the present embodiments include application of electrical fields over narrow distances, for example across the capacitance gap of an electrically-coupled LC resonator, which may be less than 1 mm, and in some cases less than 100 microns. Hence, relatively high field strengths may be obtained using reasonable voltages.

In other examples, bistable ferroelectric capacitors may be used. A capacitor may be sectioned, or a plurality of capacitors used, to allow capacitance to be adjusted by discrete amounts, for example evenly spaced fractions of a total available capacitance. In some cases, charge applied to a capacitor may be selected so as to switch a desired fraction of a ferroelectric material, allowing capacitance tuning to be obtained.

Other ferroelectric materials may be used, such as lead scandium tantalate, other tantalates, lead zirconium titanate, lanthanum-doped lead zirconate titanate, other titanates, other perovskites, other inorganic ferroelectrics, and polymer ferroelectrics such as polyvinylidene difluoride (PVDF).

In some examples, electrical transients (including electrical pulses) may be used to modify the average permittivity of a switchable ferroelectric film.

Phase Change Tunable Materials

In some examples of the present invention, the tunable material is a phase change material. Examples of phase change materials include materials that convert from a first phase to a second phase, wherein the first phase is a crystalline phase and the second phase is an amorphous phase. Phase conversion can be reversible, so a tunable material may be converted between first and second phases using a control signal.

In some examples, the tunable material may include a mixture of first phase and second phase, for example a mixture of crystalline and amorphous forms. The ratio of crystalline and amorphous forms may be adjusted using the control signal, allowing variation of an electromagnetic property such as permittivity. The permittivity of a phase change material may be different in a first phase relative to a second phase. Hence modifying the phase of the material allows adjustment of the electromagnetic response of a metamaterial including it. For example, chalcogenide phase change materials have different permittivities in amorphous and crystalline states. Hence, the electromagnetic response of a metamaterial can be modified by changing the phase of a tunable material within one or more unit cells of the metamaterial.

Example phase change materials include chalcogenides including at least one chalcogen as a component. Examples include compounds of sulfur, selenium, and tellurium. Example compounds may include one or more component that is sulfur, selenium, or tellurium. Specific examples include compounds of germanium, antimony and tellurium such as $Ge_2Sb_2Te_5$ and antimony-selenium compounds such as $SbSe_x$. In some examples, the phase change material may remain in a certain form, such as crystalline, amorphous or mixed state, until another control input is used to change the state.

Hence, a metamaterial including a phase change material may be reconfigured using a control signal, and then remain in the new configuration until a further control signal is received. A control signal may include a first component sufficient to melt the phase change material, and a second component allowing controlled cooling into a desired phase configuration. A phase change material may exist in first and second phases, and be switched between two states. In some examples, a continuum of phase configurations (anywhere between pure first phase and pure second phase, including all mixed phase states) can be accessed. The first phase may be amorphous, the second crystalline, and the mixed states a mixture of crystalline and amorphous.

In other examples, a ratio of phase components may be adjusted as a function of an applied electrical field. For example, the permittivity of a mixed phase can be modified as a function of an electric field.

Further example tunable materials include compounds of one or more of the following elements: Si, Te, As, and Ge. Other examples include compounds including one or more elements from the group of elements consisting of Si, Te, As, Ge, and In. Other examples include compounds having one or more element from the group consisting of Si, Te, As, Ge, and P.

Applications

Tunable metamaterials may be used for beam steering of electromagnetic beams, RF applications, adjustable lenses, and other optical elements. In this context the term optical element refers to an element used to control electromagnetic radiation. This is not limited to optical wavelengths as the term is sometimes used but may also include IR, terahertz, and other radio wavelengths.

A particular example application is controlled beam steering for radar applications, for example, a metamaterial according to the present invention may be used in an automotive radar. The operating frequency may be approximately 77 gigahertz, or other suitable frequency. In such an application, the resonant frequency of any particular resonator may be selected to be somewhat less than the operational frequency, for example in the range of 40 to 60 gigahertz, so that the metamaterial acts as a positive refractive index material at the operating frequency. Micro-fabrication techniques may be used for fabrication of such metamaterials.

Active metamaterials allow beam steering using a low frequency control signal. A high resolution beam can be created by a lens and this beam can be steered by actively changing an index gradient in the metamaterial lens. This approach reduces the complexity and cost of RF electronics when compared with conventional approaches, for example this approach need not use a phase shifter, and single TX and RX channels. Higher reliability and faster responses are obtainable compared with a mechanically steered system.

A particular application is collision avoidance radar for an automobile. Other applications include reflectors, absorbers, switchable devices for example transforming from reflectors to absorbers, and other electromagnetic beam control devices such as beam steering devices. Active scanning of a radar beam is possible in one or more planes.

Electronic Control Signals

A control signal for a ferroelectric tunable material may be a variable amplitude electric field. The permittivity of a ferroelectric material generally varies as a monotonic function of applied field. The field may be alternating or direct. As the intensity of the field is adjusted, the permittivity of a ferroelectric tunable material may be varied between minimum and maximum values. Control signals for phase change materials may be similar to those used for ferroelectric materials. In some examples, the permittivity of the phase change material is adjusted as a function of the amplitude of an applied electric field.

In other examples, the control signal may also be used to effect phase changes within the phase change material. The signal may include a melt portion having sufficient energy to melt the phase change material. A variable parameter may be imparted energy, in the form of a current voltage product. The control signal may also include cooling portions, for example a fast cool portion in which little or no energy is imparted, and a slower cooling portion in which, for example, the electric field amplitude slowly declines. The rate of cooling may be used to control the formation of an amorphous state. In some examples, an intermediate cooling rate may allow obtaining of a mixed crystal/amorphous state. The proportion of crystalline state, which may be expressed as a percentage, may be controllable using a ramp rate of control field, for example as a variable parameter in volts per second.

Other signals may also be used to modify properties of a phase change material, such as incident radiation (e.g. IR radiation, laser radiation), externally generated thermal energy, and the like.

In some examples, a partial melting of the phase change material may be used to obtain a mixed phase state. For example a melting portion of a control signal may include insufficient energy to melt the entire material. The signal portion may have a variable parameter, which may be expressed as energy applied as a ratio to the energy required for full melting.

In some examples, a resonant circuit may include a plurality of tunable capacitors. For example, an electrically-coupled LC resonator may have two or more capacitive gaps, each having an associated tunable capacitor. In other examples, a single capacitive gap may have a plurality of capacitors associated therewith. The plurality of capacitors may include both fixed and adjustable capacitors. The plurality of capacitors may include a plurality of switchable capacitors.

Device Fabrication

Various approaches may be used to fabricate a metamaterial according to an example of the present invention. For example conventional printed circuit techniques may be used to print a conducting pattern on a substrate, for example a circuit board. The substrate material is not limited to plastic, and may also be glass, ceramic, or other dielectric. Typically, the conductivity of the dielectric is three or more magnitudes less than the conductivity of the conducting pattern under given conditions, and may be many orders of magnitude less, such as $10^{-5}$ or less.

A tunable material may be deposited using one of various techniques, for example printing, vapor deposition, chemical deposition, physical deposition, and the like. In some examples a tunable element may be separately fabricated, and appropriately located and connected to electrical signals for control thereof.

The invention is not restricted to the illustrative examples described above. Examples are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the claims.

Having described our invention, we claim:

1. A metamaterial, comprising:
    a support medium;
    a plurality of resonant circuits,
    at least one resonant circuit of the plurality of resonant circuits being a tunable resonant circuit, including:
        a conducting pattern, and
        a variable capacitor including a tunable material,
        the tunable material being located within a capacitive gap of the tunable resonant circuit,
        the capacitive gap being formed as a physical gap between first and second segments of the conducting pattern; and
        an electrical connection allowing an electrical control signal to be applied to the tunable material,
        the electrical control signal being applied directly to the first and second segments of the conducting pattern using the electrical connection,
        the tunable material having a permittivity that is adjustable using the electrical control signal, using an electric field provided by the electrical control signal to adjust both the permittivity of the tunable material and a resonance frequency of the tunable resonant circuit,
        the tunable material being a ferroelectric material.

2. The metamaterial of claim 1, wherein the support medium is a dielectric substrate, the conducting pattern being disposed on the dielectric substrate.

3. The metamaterial of claim 1, the permittivity of the ferroelectric material being correlated with the electric field provided by the electrical control signal.

4. The metamaterial of claim 1, the conducting pattern being an electrically-coupled LC resonator,
    the capacitive gap having a capacitance correlated with the permittivity of the tunable material.

5. The metamaterial of claim 4, the electrical connection allowing the electrical control signal to be applied across the capacitive gap between the first and second segments of the conducting pattern,
    the first and second segments being coplanar and spaced apart on the support medium so as to form the capacitive gap.

6. A metamaterial lens including the metamaterial of claim 1, the metamaterial lens having a lens property adjustable using the electrical control signal.

7. A beam steering device including the metamaterial lens of claim 6.

* * * * *